(12) United States Patent
Lyublinski et al.

(10) Patent No.: US 6,551,552 B1
(45) Date of Patent: Apr. 22, 2003

(54) SYSTEMS AND METHODS FOR PREVENTING AND/OR REDUCING CORROSION IN VARIOUS ARTICLES

(75) Inventors: Efim Ya Lyublinski, Mayfield Hts., OH (US); Donald A. Kubic, Dickinson, ND (US)

(73) Assignee: COR/SCI LLC, Beachwood, OH (US)

( * ) Notice: Subject to any disclaimer, the term of this patent is extended or adjusted under 35 U.S.C. 154(b) by 0 days.

(21) Appl. No.: 09/671,233

(22) Filed: Sep. 27, 2000

(51) Int. Cl.[7] ............................................... C23F 11/02
(52) U.S. Cl. ............................. 422/9; 252/380; 422/10
(58) Field of Search ........................ 422/9, 10; 99/467; 206/330, 331, 332; 252/392, 394, 396, 380

(56) References Cited

U.S. PATENT DOCUMENTS

| | | | |
|---|---|---|---|
| 3,433,577 A | 3/1969 | Shick | 21/2.5 |
| 3,464,540 A | 9/1969 | Stark | 206/46 |
| 4,051,066 A | 9/1977 | Miksic et al. | 252/389 |
| 4,055,672 A | 10/1977 | Hirsch et al. | 426/127 |
| 4,275,835 A | 6/1981 | Miksic et al. | 239/60 |
| 4,290,912 A | 9/1981 | Boerwinkle et al. | 252/389 |
| 4,351,091 A | 9/1982 | Goodkin | 27/22 |
| 4,374,174 A | 2/1983 | Stricklin et al. | 428/341 |
| 4,557,966 A | 12/1985 | Weil | 428/209 |
| 4,586,963 A | 5/1986 | Smith et al. | 148/6.15 |
| 4,627,336 A * | 12/1986 | Nam | 99/467 |
| 4,687,698 A | 8/1987 | Weil et al. | 428/209 |
| 4,944,916 A | 7/1990 | Franey | 422/8 |
| 4,973,448 A | 11/1990 | Carlson et al. | 422/9 |
| 5,139,700 A | 8/1992 | Miksic et al. | 252/389.54 |
| 5,153,032 A | 10/1992 | Landers et al. | 427/327 |
| 5,209,869 A | 5/1993 | Miksic et al. | 252/389.54 |
| 5,234,105 A * | 8/1993 | Sato et al. | 206/330 |
| 5,320,778 A | 6/1994 | Miksic et al. | 252/389.54 |
| 5,326,529 A | 7/1994 | Miksic et al. | 422/7 |
| 5,332,525 A | 7/1994 | Miksic et al. | 252/389.54 |
| 5,344,589 A * | 9/1994 | Miksic et al. | 252/392 |
| 5,393,457 A | 2/1995 | Miksic et al. | 252/194 |
| 5,422,187 A | 6/1995 | Miksic et al. | 428/545 |
| 5,455,075 A | 10/1995 | Longo | 427/398.1 |
| 5,486,308 A | 1/1996 | Mayeaux | 252/194 |
| 5,593,624 A | 1/1997 | Lewis | 264/48 |
| 5,597,514 A | 1/1997 | Miksic et al. | 252/390 |
| 5,715,945 A | 2/1998 | Chandler | 206/524.4 |
| 5,718,118 A * | 2/1998 | Eisele | 62/78 |
| 5,750,053 A | 5/1998 | Miksic et al. | 252/389.52 |
| 5,824,371 A | 10/1998 | Epstein et al. | 427/388.1 |
| 5,855,975 A | 1/1999 | Miksic et al. | 428/35.8 |
| 5,871,668 A | 2/1999 | Heimann et al. | 252/389.62 |
| 5,888,281 A | 3/1999 | Longo | 106/14.21 |
| 5,894,040 A | 4/1999 | Foley et al. | 428/34.2 |
| 5,911,899 A | 6/1999 | Yoshikai et al. | 219/522 |
| 5,937,618 A | 8/1999 | Chandler | 53/427 |
| 5,958,115 A | 9/1999 | Bottcher et al. | 106/14.05 |
| 5,989,362 A | 11/1999 | Diamant et al. | 148/23 |
| 6,015,613 A | 1/2000 | Kinlen et al. | 428/332 |
| 6,028,160 A | 2/2000 | Chandler et al. | 528/176 |
| 6,054,512 A | 4/2000 | Nelson et al. | 524/91 |

FOREIGN PATENT DOCUMENTS

BR  8704319 A  *  3/1989

OTHER PUBLICATIONS

International Search Report dated Dec. 26, 2001 for PCT/US01/30767.

* cited by examiner

Primary Examiner—Robert J. Warden, Sr.
Assistant Examiner—Sean E. Conley
(74) Attorney, Agent, or Firm—Renner, Otto, Boisselle & Sklar, LLP (57) ABSTRACT

The present invention relates to a corrosion protection system and a method of protecting an article from corrosion by placing the article to be protected in a gas impermeable enclosure comprising at least one shell that is adapted to maintain an internal pressure greater than an external pressure outside of the corrosion protection system, placing at least one corrosion preventing device selected from a desiccant, a corrosion inhibitor, an inert gas, or a combination thereof, and sealing the gas impermeable enclosure of the corrosion protection system.

33 Claims, 3 Drawing Sheets

SYSTEMS AND METHODS FOR PREVENTING AND/OR REDUCING CORROSION IN VARIOUS ARTICLES

FIELD OF THE INVENTION

The invention herein described relates generally to synergistic systems and methods for preventing and/or reducing the occurrence of corrosion (including tarnishing) in a variety of articles including, but not limited to, metals, non-metals, paper articles, precious stones and semi-precious stones. More specifically, the invention herein relates to synergistic combinations of (1) a gas impermeable enclosure for holding one or more articles to be protected formed from at least one shell, where the at least one shell is adapted to maintain an internal pressure greater than an external pressure outside of the enclosure; and (2) at least one corrosion preventing device located within the gas impermeable enclosure, where the at least one corrosion preventing device is a desiccant, a corrosion inhibitor, an inert gas, and/or a combination thereof. The present invention also relates to methods which utilize synergistic systems to prevent the corrosion of a desired article.

BACKGROUND OF THE INVENTION

In commerce and industry today, the useful life of corrodible items may be extended and/or preserved by providing corrosion inhibitors which protect the corrodible item from the adverse effects of its ambient environment. Among the common indications of corrosion manifested in useful metallic articles are oxidation, pitting, tarnishing, mottling, or discoloration of the surfaces of these items. These manifestations occur in metallic articles, particularly when exposed to oxygen, in either gaseous or liquid phase. Additionally, sulfides and/or chlorides (or chlorine) may cause corrosion or tarnishing problems as well. Inasmuch as both oxygen and water, including water vapor, occur normally and are available in nature, it is normally necessary to take precautions against corrosion when packaging metallic items for shipment or storage, or when subjecting such items to normal use. Metals which are frequently found to be susceptible to corrosion under normal atmospheric and ambient conditions include, but are not limited to, iron, copper, brass, aluminum, silver, and alloys of these metals.

Additionally, suitable protection may also be needed for valuable non-metal items such as precious and/or semi-precious stones and the like.

In view of the widespread need for protecting various articles from corrosion, be the articles metallic or otherwise, a variety of systems have been utilized. Such anti-corrosion systems often employ one or more of the following as components or sub components thereof: (1) a desiccant; (2) a volatile corrosion inhibitor (VCI) or a volatile corrosion inhibiting film; and/or (3) an inert atmosphere.

Figure 1:
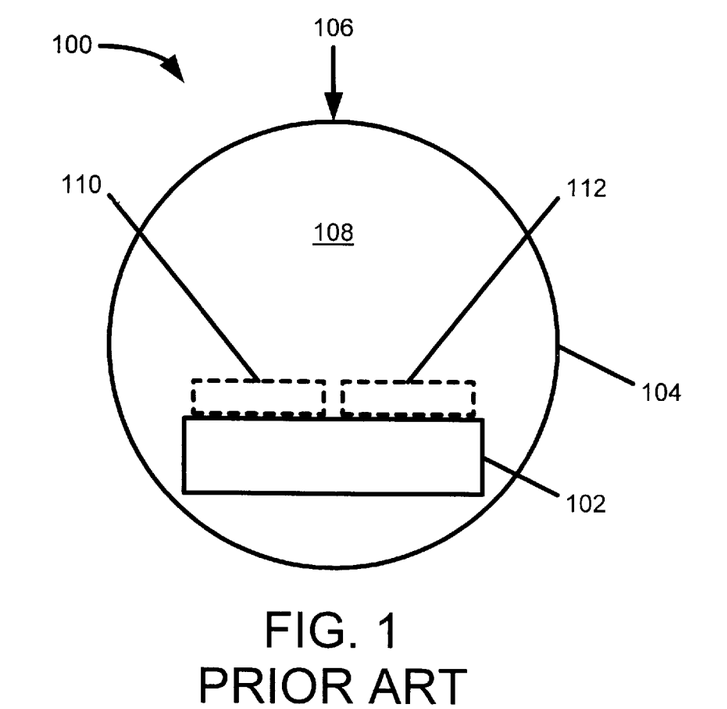
FIG. 1 illustrates a prior art anti-corrosion system.

One such known anti-corrosion system 100 is illustrated in FIG. 1, and comprises an enclosure 104 in which an article 102 is placed in order to protect the article 102 from corrosive elements 106. The enclosure 104 can be any one of a variety of enclosures including a polymer or plastic enclosure, a paper enclosure, a metal enclosure or a metal-coated polymer enclosure. In some cases the enclosure itself can contain a volatile corrosion inhibitor and/or a desiccant. The enclosure 104 is hermetically sealed using any suitable means (e.g., heat sealing, an adhesive seal, a mechanical sealing means, etc.) The enclosure 104 may contain a volatile corrosion inhibitor and/or a desiccant within the structure of the enclosure 104. Such films are known in the art, see, for example U.S. Pat. Nos. 4,290,912; 4,944,916; and 5,320,778. Once the enclosure 104 is hermetically sealed the anti-corrosion system contains a discrete atmosphere 108 where the concentration of either the volatile corrosion inhibitor and/or the desiccant is higher than the concentration of the volatile corrosion inhibitor and/or the desiccant outside the enclosure. Alternatively, the anti-corrosion system 100 can contain a desiccant service capsule 110 and/or an inhibitor service capsule 112 within the enclosure rather than such elements being self contained in the enclosure itself.

Such methods although effective are not suitable for all metals, non-metals, semi-precious and precious stones, and other valuable articles which may need to be protected. Additionally, such methods have service lives which are not suitable for some applications in which a long service life is necessary, for example, the protection of military equipment and/or hazardous materials.

SUMMARY OF THE INVENTION

The present invention relates to a method of protecting one or more articles from corrosion comprising the steps of: (A) placing the one or more articles to be protected in a corrosion protection system, the corrosion protection system comprising: a gas impermeable enclosure for holding one or more articles to be protected comprising at least one shell that is adapted to maintain an internal pressure greater than an external pressure outside of the corrosion protection system; (B) placing at least one corrosion preventing device into the gas impermeable enclosure, wherein the at least one corrosion preventing device is selected from a desiccant, a corrosion inhibitor, an inert gas, or a combination thereof; and (C) sealing the at least one shell of the gas impermeable enclosure.

In accordance with another aspect of the invention, a corrosion protection system comprises: a gas impermeable enclosure for holding one or more articles to be protected comprising at least one shell that is adapted to maintain an internal pressure greater than an external pressure outside of the corrosion protection system; and at least one corrosion preventing device located within the gas impermeable enclosure, wherein the at least one corrosion preventing device is selected from a desiccant, a corrosion inhibitor, an inert gas, or a combination thereof.

To the accomplishment of the foregoing and related ends, the invention, then, comprises the features hereinafter fully described and particularly pointed out in the claims. These embodiments are indicative, however, of but a few of the various ways in which the principles of the invention may be employed. Other objects, advantages and features of the invention will become apparent from the following detailed description of the invention.

DETAILED DESCRIPTION OF THE INVENTION

The present invention involves a method of protecting an item from corrosion which utilizes a synergistic combination of a gas impermeable enclosure for holding one or more articles to be protected comprising at least one shell, wherein the at least one shell is adapted to maintain an internal pressure greater than an external pressure outside of the corrosion protection system; and at least one corrosion preventing device located within the gas impermeable enclosure, wherein the at least one corrosion preventing device is selected from a desiccant, a corrosion inhibitor, an inert gas, or a combination thereof. Additionally, it should be noted that in the following text, range and ratio limits may be combined.

As used throughout the text and claims, a desiccant means any compound capable of adsorbing or absorbing water and/or at least one corrosive compound. Additionally, as used throughout the text and claims, corrosion includes not only tarnishing, rusting and other forms of corrosion, but also includes any detrimental or unwanted degradation of an article to be protected. Accordingly, as used throughout the text and claims a corrosive element or compound means any compound which given the nature of the article to be protected can cause the article to corrode or undergo corrosion.

As used throughout the text and the claims, a gas impermeable enclosure can be of any shape or size. For example, as used throughout the text and claims a gas impermeable enclosure can be, but is not limited to, a bag, a room, a box, and a canister. Additionally, as used throughout the text and claims a shell means any structure which by itself is capable of being gas impermeable. Such a shell structure can be a single or multi-layered structure. Also the shells utilized in the present invention need not just be made of one type of material (such as solely from a polymer, plastic, metal, etc.). Rather the shells of the present invention can be made from a combination of different or similar materials (such as a combination of metal and polymer, or a combination of two different polymers).

In one embodiment, a gas impermeable enclosure according to the present invention, means any enclosure, be it made of a polymer, a plastic, a metal, paper, wood, etc., which can maintain an internal pressure which is slightly greater than the external pressure outside the enclosure for at least about 24 hours. In this embodiment, the gas impermeable enclosure ideally has no tears, leaks, pinholes, etc. which would allow the higher internal pressure to equalize with the slightly lower external pressure. Additionally, it should be noted that the increased pressure atmosphere inside the gas impermeable enclosure can be supplied by any suitable gas.

In another embodiment, a gas impermeable enclosure according to the present invention means any enclosure, be it made of a polymer, a plastic, a metal, paper, wood, etc., which can maintain an internal pressure which is slightly greater than the external pressure outside the enclosure for at least about 48 hours using a system by which to supplement the internal pressure in the enclosure so as to maintain it at a slightly higher pressure than the pressure outside the enclosure. Additionally, it should be noted that the increased pressure atmosphere inside the gas impermeable enclosure can be supplied by any suitable gas.

In one embodiment, the amount of the surface area of the enclosure which is not gas impermeable is less than about 30 percent of the surface area of the whole enclosure. In another embodiment, the amount of the surface area of the enclosure which is not gas impermeable is less than about 10 percent of the surface area of the whole enclosure. In yet another embodiment, the amount of the surface area of the enclosure which is not gas impermeable is less than about 5 percent of the surface area of the whole enclosure. In still another embodiment, the amount of the surface area of the enclosure which is not gas impermeable is less than about 1 percent of the surface area of the whole enclosure.

In the embodiment where the gas impermeable enclosure is formed from any suitable polymer or plastic compound, such compounds include, but are not limited to, polyolefins, metallicized polyolefins, Mylar films, and elastomers (natural and synthetic). In one embodiment, the polymer used to form a polymeric based enclosure is at least one polyethylene, polypropylene or ethylene/vinyl acetate copolymer.

In the embodiment where the gas impermeable enclosure is formed from or contains metal, any suitable metal may be used. Such metals include, but are not limited to, copper, iron, tin, zinc, aluminum, silver, gold, chromium, titanium, palladium, iridium, cobalt, tungsten, palatinum, lead, nickel, cadmium, bismuth, zirconium, bronze, alloys thereof, amalgams thereof and mixtures thereof.

In the embodiment where the gas impermeable enclosure is formed from a substance other than those noted above, any suitable substance such as glass, paper, and/or wood may be used so long as the enclosure formed therefrom meets at least one of the requirements discussed above with regard to gas-impermeability.

As noted above, the article to be protected can be any type of article. Such articles range from metal or metal containing objects (such as jewelry, military items, circuit boards, computer components, etc.), artifacts (paintings, tapestries, pottery, etc), and semi-precious or precious stones. In short the present invention can be used to protect any item, be it valuable or otherwise, from any corrosive or destructive environment. Such corrosive substances include, but are not limited to, water vapor (or water), oxygen, ozone, sulfur dioxide, hydrogen sulfide, ammonium and/or chlorine ions (e.g., in the form of hydrochloric acid).

In one embodiment, the increased internal pressure in the gas impermeable enclosure of the present invention is supplied by an inert gas. The inert atmosphere can be supplied by any suitable gas so long as it does not adversely react with the article to be protected. Those skilled in the art will readily be able to recognize what gas or gases are inert in view of the make up of the article to be protected. Some examples of suitable inert gases include, but are not limited to, helium, nitrogen, argon, dry air (having a relative humidity of less than about 10%, or less than about 5%, or even less than about 1%) and ammonia.

In one embodiment, the gas impermeable enclosure is filled with a suitable inert gas after the article to be protected has been placed therein and then is hermetically sealed in any suitable manner. In another embodiment, the inert gas is supplied via an inert gas service capsule which generates an inert gas over a period of time. Such a service capsule could be a canister of an inert gas that discharges over time or all at once to produce the desired increased pressure in the enclosure. In any case, the service capsule containing an inert gas and/or an inert gas generating means is placed into the gas impermeable enclosure prior to it being hermetically sealed.

In yet another embodiment, the gas impermeable enclosure contains in its shell a discrete layer of inert gas. Such a layer can be in the form of "inert gas" pockets in one or more layers of the shell of the gas impermeable enclosure.

In another embodiment, the increased internal pressure in the gas impermeable enclosure of the present invention is supplied by any suitable gas be it inert or non-inert given the nature of the article to be protected (e.g., standard air, no matter what the humidity level), in any one of the manners described above. In such a case at least one corrosion preventing device is added to the gas impermeable enclosure to protect the article therein against any corrosive elements which might be present in the gas used to provide the increased pressure atmosphere within the enclosure. For example, a desiccant in any suitable form, a vapor phase or volatile corrosion inhibitor in any suitable form, and/or an inert gas service capsule can be added (or contained) with the gas impermeable enclosure to ensure that any corrosive elements present in the gas used to create the increased pressure atmosphere do not damage the article to be protected.

In one embodiment, the internal pressure of the gas impermeable enclosure is at least about 1 percent higher than the pressure outside the enclosure. In another embodiment, the internal pressure of the gas impermeable enclosure is at least about 5 percent higher than the pressure outside the enclosure. In yet another embodiment, the internal pressure of the gas impermeable enclosure is at least about 10 percent higher than the pressure outside the enclosure. In still another embodiment, the internal pressure of the gas impermeable enclosure is at least about 20 percent higher than the pressure outside the enclosure.

Alternatively, the pressure inside the gas impermeable enclosure can be measured in terms of kilo Pascals (KPa). In one embodiment, the internal pressure inside the gas impermeable enclosure is at least about 106 KPa. In another embodiment, the internal pressure inside the gas impermeable enclosure is at least about 112 KPa. In yet another embodiment, the internal pressure inside the gas impermeable enclosure is at least about 122 KPa. In still another embodiment, the internal pressure inside the gas impermeable enclosure is at least about 152 KPa. In still another embodiment, the internal pressure inside the gas impermeable enclosure is at least about 202 KPa, even more than about 303 KPa, or even more than about 506 KPa.

In one embodiment, the present invention utilizes a desiccant (be it in a discrete desiccant service capsule, a tablet, a powder, pellets, or embedded or impregnated in the gas impermeable enclosure itself) in addition to the increased pressure atmosphere. Any suitable desiccant can be used in the present invention. Such desiccants includes, but are not limited to, silica gel, calcium oxide (CaO), sodium hydroxide (NaOH), sodium bicarbonate ($NaHCO_3$), potassium borate ($K_3BO_3$) and zinc borate ($Zn_3(BO_3)_2$ or, more appropriately, $3ZnO.B_2O_3$). In one embodiment, the gas impermeable enclosure is filled with a suitable desiccant and then is hermetically sealed in any suitable manner (e.g., heat sealing, an adhesive seal, a mechanical sealing means, welding, etc.).

Alternatively, the gas impermeable enclosure may contain a system which at regular intervals replenishes and/or adds desiccant to the interior of the gas impermeable enclosure. In yet another embodiment, the gas impermeable enclosure may contain a system which includes a sensor (or some other device) which detects the concentration of one or more corrosive compounds which the chosen desiccant(s) has an ability to remove. When such concentration(s) rise above a predetermined threshold the system in the gas impermeable enclosure adds the necessary amount of desiccant to reduce the concentration of the one or more corrosive compounds to below the threshold levels.

It should be noted that when a desiccant adding system is included in the gas impermeable enclosure, such a system should not allow the increased internal pressure in the gas impermeable enclosure to escape when the system is adding desiccant to the enclosure. That is, the system itself should be able to maintain an increased internal pressure relative to an external pressure. This does not mean however that the system itself cannot be opened to be replenished with additional desiccant. Rather, it means that if the system is capable of being opened for replenishment, the system should have a means for maintaining the internal pressure of the gas impermeable enclosure. For example, when not adding desiccant to the gas impermeable enclosure, the system could have some manner by which to hermetically seal the entry way into the gas impermeable enclosure.

In another embodiment, the present invention utilizes a vapor phase or volatile corrosion inhibitor. Any suitable corrosion inhibitor can be used. U.S. Pat. Nos. 4,290,912; 5,320,778; and 5,855,975 disclose vapor phase or volatile corrosion inhibitors and are incorporated herein by reference in their entirety for their teachings of such compounds. For example, useful vapor phase or volatile corrosion inhibitors include, but are not limited to, anhydrous sodium molybdate and mixtures of such molybdates with sodium nitrite, benzotriazole, and mixtures of benzoates of amine salts with benzotriazole, nitrates of amine salts, and $C_{13}H_{26}O_2N$.

It should be noted that the present invention is not limited to any one vapor phase or volatile corrosion inhibitor. Rather, as is noted above, the present invention can be used in conjunction with one or more suitable vapor phase or volatile corrosion inhibitors. In one embodiment, the gas impermeable enclosure is filled with a suitable corrosion inhibitor and then is hermetically sealed in any suitable manner (e.g., heat sealing, an adhesive seal, a mechanical sealing means, welding, etc.). In another embodiment, the corrosion inhibitor is supplied via a corrosion inhibitor service capsule which generates the desired corrosion inhibitor over the desired period of time. Such a service capsule could be a canister or packet of corrosion inhibitor that discharges over time or all at once to produce the desired concentration of corrosion inhibitor in the enclosure. Such corrosion inhibitor service capsules are well known in the art. For example, see U.S. Pat. No. 4,973,448, which is hereby incorporated by reference in its entirety, which discloses a vapor phase corrosion inhibiting compound contained in an envelope which allows only the vapor phase of the corrosion inhibiting compound to escape and not the solid form thereof. In another embodiment, the corrosion inhibitor service capsule can generate simultaneously both the necessary increased pressure and the required corrosion inhibitor.

In yet another embodiment, the gas impermeable enclosure contains in its shell a discrete layer of corrosion inhibitor and/or desiccant, or is impregnated with such one or more compounds in any suitable manner. Polymer films in particular lend themselves to being impregnated with at least one corrosion inhibitor and/or desiccant. Such films are widely known in the art. For example, U.S. Pat. No. 4,290, 912, which is hereby incorporated by reference in its entirety, discloses such films. In the instance when the gas impermeable enclosure is other than a polymer film, those of ordinary skill in the art would recognize that other enclosures can be formed so as to include a layer of corrosion inhibitor or can be impregnated with such a compound.

In another embodiment, the vapor phase or volatile corrosion inhibitor can be periodically added or added on an as needed basis via a system similar to that described above with reference to a desiccant. In this instance however, if the vapor phase or volatile corrosion inhibitor is added on an as needed basis it can be done in response to a device which establishes either the concentration of the desired vapor phase corrosion inhibitor or in response to a sensor which determines the internal pressure inside of the gas impermeable enclosure.

Figure 2:
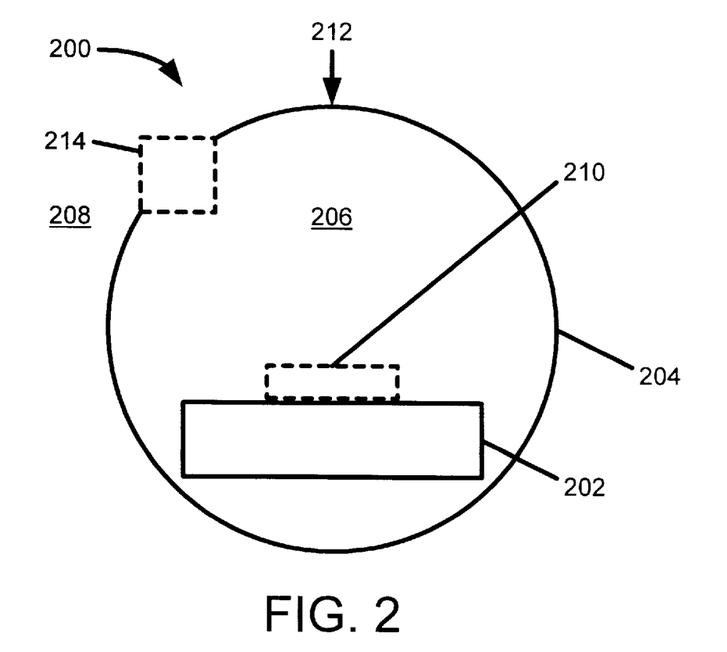
FIG. 2 illustrates a corrosion protection system according to one embodiment of the present invention.

Turning now to the figures, FIG. 2 illustrates one embodiment of the present invention. In the corrosion-protection system 200 of FIG. 2, an article 202 to be protected is placed in a gas-impermeable enclosure 204. The gas impermeable enclosure 204 can be any shape or size, and can be formed from any suitable material, as is discussed above. The only requirement of the gas impermeable enclosure 204 is that it meets at least one of the above-mentioned definitions of gas impermeability. In the embodiment of FIG. 2, the gas impermeable enclosure 204 comprises one shell. At a minimum, the gas impermeable enclosure 204 also contains at least one corrosion preventing device located within the gas impermeable enclosure. As used throughout the text and claims, a corrosion preventing device means any desiccant, any corrosion inhibitor (be it vapor phase or volatile), any suitable inert gas (in view of the article to be protected), or a combination thereof.

In one embodiment, the at least one corrosion preventing device is contained within the shell of the gas impermeable enclosure 204. For example, where the gas impermeable enclosure 204 is formed from one or more layers of polymer, the corrosion preventing device can be either contained between two layers or can be formed so as to be on the inside of the innermost layer of the gas impermeable enclosure 204. It should be noted that when the shell of the gas impermeable enclosure 204 is composed of more than one layer, not all the layers need to be gas impermeable. Instead, at a minimum, one layer needs to be gas impermeable so as to make certain that the structure meets one or more of the gas impermeable requirements set forth above.

In the situation where an inert gas is used as the corrosion preventing device, the gas impermeable enclosure can be filled with such a gas prior to it being sealed to form the increased pressure atmosphere 206 in the gas impermeable enclosure. As noted above the pressure of atmosphere 206 contained within the gas impermeable enclosure 204 is set to be slightly higher than the external pressure 208. Alternatively, pressure 206 can be set even higher so as to still offer protection in the instances where the external pressure 208 may fluctuate. That is, the internal pressure 206 should be set high enough to ensure that it will remain slightly above any external pressure that may be encountered during any movement of the corrosion protection system 200.

In another embodiment, the increased pressure atmosphere is provided by a gas other than an inert gas (e.g., ordinary air). In this case, a desiccant and/or a volatile corrosion inhibitor is either present within the structure of the gas impermeable enclosure or is placed therein in the form of one or more service capsules 210.

In another embodiment, the service capsule 210 is any device or compound which can generate, as needed, an inert gas. Such a capsule 210 can generate the gas in a single operation or can generate gas over an extended period of time.

After at least one article 202 to be protected is placed in the gas impermeable enclosure 204, at least one corrosion preventing device (if such a device is not already present in the enclosure itself) is placed within the gas impermeable enclosure 204. Then, if necessary, the enclosure 204 is given an internal atmosphere having an increased pressure as compared to the external pressure and then hermetically sealed in any suitable manner so as to prevent the entry of any corrosive elements 212 into the internal atmosphere 206 of the gas impermeable enclosure 204.

Figure 3:
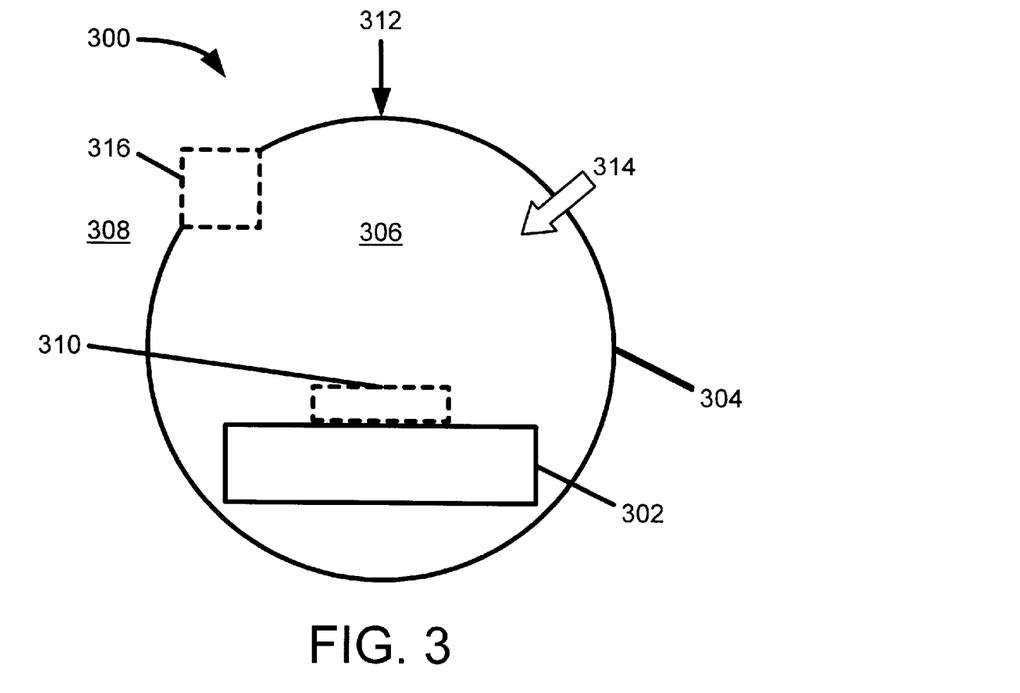
FIG. 3 illustrates a corrosion protection system according to another embodiment of the present invention.

FIG. 3 illustrates a corrosion protection system 300 according to another embodiment of the present invention which is similar to that of FIG. 2. FIG. 3 also has an article 302 to be protected from corrosive elements 312 by placing the article 302 inside a gas impermeable enclosure 304 and sealing the enclosure in any suitable manner. The gas impermeable enclosure 304 has an increased internal pressure 306 versus the external pressure 308. As noted above with regard to FIG. 2, the embodiment of FIG. 3 also contains at least one corrosion preventing device located within the gas impermeable enclosure. Such a corrosion preventing device can be in the form of an inert atmosphere which provides the increased pressure 306 or can be in the form of at least one service capsule 310. The nature of the corrosion preventing device in the embodiment of FIG. 3 is similar to that described above with regard to FIG. 2.

The major difference between the corrosion protection system 200 depicted in FIG. 2 and the corrosion protection system 300 depicted in FIG. 3 is that the system 300 of FIG. 3 has a gas impermeable enclosure 304 which includes a replenishment system 314 (represented by the arrow). The replenishment system 314 allows for the service life of the corrosion protection system 300 to be further increased because the replenishment system 314 can be designed to supplement and/or replace any lost pressure and/or corrosion preventing device.

In one embodiment, the replenishment system 314 replenishes the designated corrosion preventing device(s) at a set time interval (e.g., every 24 hours, once every week, etc.). In another embodiment, system 314 includes a monitoring means (be it a pressure gauge, a means for determining the concentration of a substance in an atmosphere, etc.) which signals the system 314 when the pressure within the enclosure 304 and/or the concentration of one or more of the corrosion preventing devices is either too low or is depleted. When the system 314 is notified that such a situation exists, the system 314 either adds more pressure, or more of the needed corrosion preventing device until the pressure or concentration within the enclosure 304 is once again above a set or predetermined minimum.

In another embodiment, either one or both of the corrosion protection systems of FIGS. 2 and 3 can optionally include an alarm system (214 and 316, respectively) that monitors the internal pressure within the gas impermeable enclosures in case of catastrophic failure of the gas impermeable enclosures. Such a system is desirable when the article (or articles) stored therein are hazardous (e.g., hazardous waste, biomedical wastes, etc.).

Figure 4:
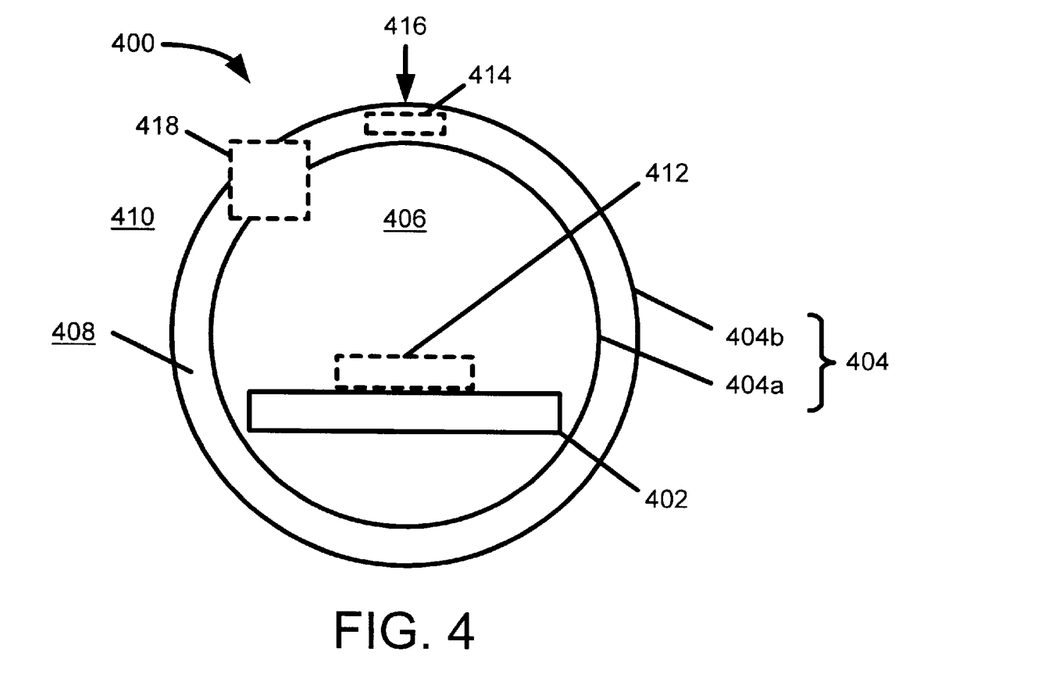
FIG. 4 illustrates a corrosion protection system according to yet another embodiment of the present invention.

FIG. 4 illustrates a corrosion protection system 400 according to another embodiment of the present invention. Corrosion protection system 400 has an article 402 to be protected from corrosive elements 416 which is placed in a gas impermeable enclosure 404. The gas impermeable enclosure 404 can be any shape or size, and can be formed from any suitable material, as is discussed above. Gas impermeable enclosure 404 has at least two distinct shells 404a and 404b with one of the shells 404a being slightly smaller than the other shell 404b so that the smaller shell 404a can be completely inserted into the larger one 404b. Each of the shells 404a and 404b is itself gas impermeable as defined above. Thus, the shells 404a and 404b create two different and discrete gas impermeable enclosures, an inner enclosure area 406 and an outer enclosure area 408. Each of these enclosure areas is capable of maintaining an increased pressure when compared to the external pressure 410.

With regard to the gas impermeable enclosure 404, each of the shells 404a and 404b can be of any shape and or size so long as one is small enough to fit within the other. Additionally, it is not necessary that both shells be composed of the same material or materials so long as both shells are gas impermeable in their own right.

In one embodiment, the inner enclosure area 406 has a higher pressure than the outer enclosure area 408 which in turn has a sigher pressure than the external area 410. Thus, with regard to pressure, this embodiment has the following pressure relationship 406>408>410. In another embodiment, the inner enclosure area 406 has a higher pressure than the external area 410 but a lower pressure than the outer enclosure area 408. In this embodiment, the pressure of the outer enclosure area 408 is higher than that of both the inner enclosure area 406 and the external area 410. Thus, with regard to pressure, this embodiment has the following pressure relationship 408>406>410.

In yet another embodiment, the pressure of the inner enclosure area 406 and that of the outer enclosure area 408 are both higher than the pressure of external area 410 and are about equal to one another. Thus, with regard to pressure, this embodiment has the following pressure relationship 406≈408>410.

At a minimum, at least one of the shells 404a and 404b also contains at least one corrosion preventing device located within at least one of the gas impermeable enclosure areas 406 and 408. In one embodiment, the at least one corrosion preventing device is contained within the shell of the gas impermeable enclosure 404a and/or 404b. For example, where at least one of the shells 404a and 404b is formed from one or more layers of polymer, the corrosion preventing device can be either contained between two layers or can be formed so as to be on the inside of the inner most layer of the shell 404a and/or 404b. It should be noted that when shell 404a and/or 404b is composed of more than one layer, not all the layers need to be gas impermeable. Instead, at a minimum, one layer needs to be gas impermeable so as to make certain that the structure meets one or more of the gas impermeable requirements set forth above.

In the situation where an inert gas is used as the corrosion preventing device, at least one gas impermeable enclosure area 406 and/or 408 can be filled with such a gas prior to it being sealed to form the increased pressure atmosphere in such an enclosure area.

As noted above the pressure of both atmospheres 406 and 408 are set to be slightly higher than the external pressure 410, with the pressures of 406 and 408 either being equal to, greater than or less than one another. Alternatively, the pressures of 406 and 408 can be set even higher so as to still offer protection in the instances where the external pressure 410 may fluctuate. That is, the internal pressures 406 and 408 should be set high enough to ensure that they will remain slightly above any external pressure that may be encountered during any movement of the corrosion protection system 400.

In another embodiment, the increased pressure atmosphere is provided by a gas other than an inert gas (e.g., ordinary air). In this case, a desiccant and/or a volatile corrosion inhibitor is present within the structure of at least one of the shells 404a and 404b of the gas impermeable enclosure 404 or is placed within at least one of the enclosure areas 406 and/or 408 in the form of one or more service capsules 412 and/or 414.

In another embodiment, the service capsules 412 and/or 414 are any device or compound which can generate, as needed, an inert gas. Such capsules 412 and/or 414 can generate the gas in a single operation or can generate gas over an extended period of time.

After the gas impermeable enclosure is filled with at least one article 402 to be protected, at least one corrosion preventing device (if such a device is not already present in the enclosure itself), and, if necessary, given an internal atmosphere having an increased pressure as compared to the external pressure, the inner shell 404a is then hermetically sealed in any suitable manner and placed within the outer shell 404b. The outer shell 404b is then prepared in a manner similar to that of the inner shell 404a so as to prevent the entry of any corrosive elements 416 into either one or both of the shells.

Figure 5:
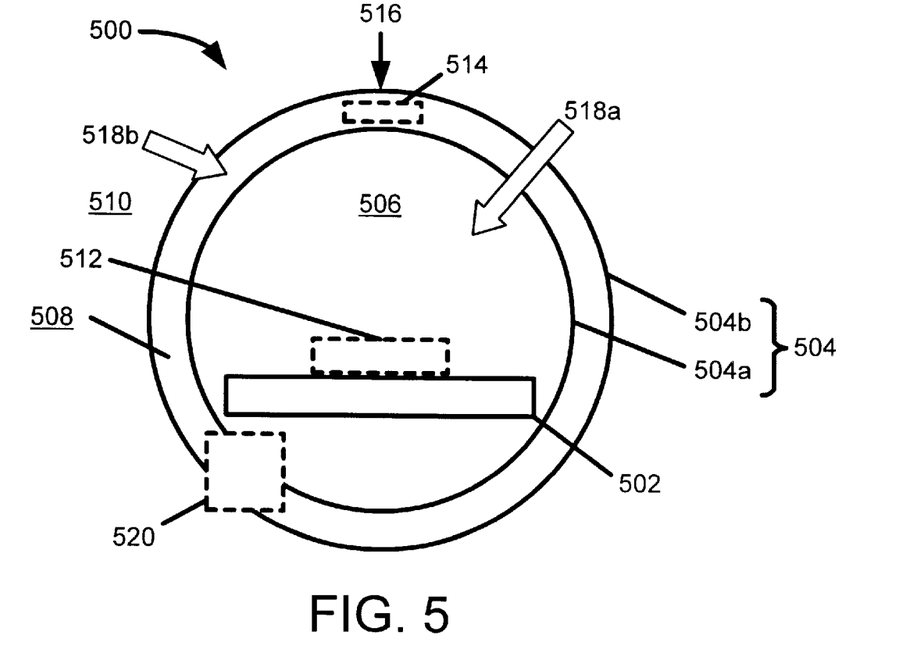
FIG. 5 illustrates a corrosion protection system according to still another embodiment of the present invention.

FIG. 5 illustrates a corrosion protection system 500 according to another embodiment of the present invention. Corrosion protection system 500 has an article 502 to be protected from corrosive elements 516 which is placed in a gas impermeable enclosure 504. The gas impermeable enclosure 504 can be any shape or size, and can be formed from any suitable material, as is discussed above. Gas impermeable enclosure 504 has at least two distinct shells 504a and 504b with one of the shells 504a being slightly smaller than the other shell 504b so that the smaller shell 504a can be completely inserted into the larger one 504b. Each of the shells 504a and 504b is itself gas impermeable as defined above. Thus, the shells 504a and 504b create two different and discrete gas impermeable enclosures, an inner enclosure area 506 and an outer enclosure area 508. Each of these enclosure areas is capable of maintaining an increased pressure when compared to the external pressure 510.

With regard to the gas impermeable enclosure 504, each of the shells 504a and 504b can be of any shape and or size so long as one is small enough to fit within the other. Additionally, it is not necessary that both shells be composed of the same material or materials so long as both shells are gas impermeable in their own right.

In one embodiment, the inner enclosure area 506 has a higher pressure than the outer enclosure area 508 which in turn has a higher pressure than the external area 510. Thus, with regard to pressure, this embodiment has the following pressure relationship 506>508>510. In another embodiment, the inner enclosure area 506 has a higher pressure than the external area 510 but a lower pressure than the outer enclosure area 508. In this embodiment, the pressure of the outer enclosure area 508 is higher than that of both the inner enclosure area 506 and the external area 510. Thus, with regard to pressure, this embodiment has the following pressure relationship 508>506>510.

In yet another embodiment, the pressure of the inner enclosure area 506 and that of the outer enclosure area 508 are both higher than the pressure of external area 510 and are about equal to one another. Thus, with regard to pressure, this embodiment has the following pressure relationship 506≈508>510.

At a minimum, at least one of the shells 504a and 504b also contains at least one corrosion preventing device located within at least one of the gas impermeable enclosure areas 506 and 508. In one embodiment, the at least one corrosion preventing device is contained within the shell of the gas impermeable enclosure 504a and/or 504b. For example, where at least one of the shells 504a and 504b is formed from one or more layers of polymer, the corrosion preventing device can be either contained between two layers or can be formed so as to be on the inside of the inner most layer of the shell 504a and/or 504b. It should be noted that when shell 504a and/or 504b is composed of more than one layer not all the layers need to be gas impermeable. Instead, at a minimum, one layer needs to be gas impermeable so as to make certain that the structure meets one or more of the gas impermeable requirements set forth above.

In the situation where an inert gas is used as the corrosion preventing device, at least one gas impermeable enclosure area 506 and/or 508 can be filled with such a gas prior to it being sealed to form the increased pressure atmosphere in such an enclosure area.

As noted above the pressure of both atmospheres 506 and 508 are set to be slightly higher than the external pressure 510, with the pressures of 506 and 508 either being equal to, greater than or less than one another. Alternatively, the pressure of 506 and 508 can be set even higher so as to still offer protection in the instances where the external pressure 510 may fluctuate. That is, the internal pressures 506 and 508 should be set high enough to ensure that they will remain slightly above any external pressure that may be encountered during any movement of the corrosion protection system 500.

In another embodiment, the increased pressure atmosphere is provided by a gas other than an inert gas (e.g., ordinary air). In this case, a desiccant and/or a volatile corrosion inhibitor is found within the structure of at least one of the shells 504a and 504b of the gas impermeable enclosure 504 or is placed within one of the enclosure areas 506 and/or 508 in the form of one or more service capsules 512 and/or 514.

In another embodiment, the service capsules 512 and/or 514 are any device or compound which can generate, as needed, an inert gas. Such capsules 512 and/or 514 can generate the gas in a single operation or can generate gas over an extended period of time.

After the gas impermeable enclosure is filled with at least one article 502 to be protected, at least one corrosion preventing device (if such a device is not already present in the enclosure itself), and, if necessary, given an internal atmosphere having an increased pressure as compared to the external pressure, the inner shell 504a is then hermetically sealed in any suitable manner and placed within the outer shell 504b. The outer shell 504b is then prepared in a manner similar to that of the inner shell 504a so as to prevent the entry of any corrosive elements 516 into either one or both of the shells.

The major difference between the corrosion protection system 400 depicted in FIG. 4 and the corrosion protection system 500 depicted in FIG. 5 is that at least one of the gas impermeable enclosures 504a and 504b of FIG. 5 includes a replenishment system 518a and/or 518b, respectively (represented by the arrows). The replenishment systems 518a and/or 518b allow for the service life of the corrosion protection system 500 to be further increased because the replenishment systems 518a and/or 518b can be designed to supplement and/or replace any lost pressure and/or corrosion preventing device. It should be noted that in this embodiment, the replenishment systems 518a and 518b can be designed to act independently of one another, or can be designed to act in unison.

In one embodiment, the replenishment systems 518a and/or 518b replenish the designated corrosion preventing device(s) at a set time interval (e.g., every 24 hours, once every week, etc.). In another embodiment, systems 518a and/or 518b include a monitoring means (be it a pressure gauge, a means for determining the concentration of a substance in an atmosphere, etc.) which signal the systems 518a and/or 518b when the pressure within their respective enclosures and/or the concentration of one or more of the corrosion preventing devices in their respective enclosures is either too low or is depleted. When either one or both of the systems 518a and/or 518b are notified that such a situation exists, the appropriate system or systems either adds more pressure, or more of the needed corrosion preventing device until the pressure or concentration within the respective enclosure is once again above a set minimum.

In another embodiment, either one or both of the corrosion protection systems of FIGS. 4 and 5 can optionally include an alarm system (418 and 520, respectively) that monitors the internal pressure within at least one shell of the gas impermeable enclosures in case of catastrophic failure of one or more of the shells of the gas impermeable enclosures. Such a system is desirable when the article (or articles) stored therein are hazardous (e.g., hazardous waste, biomedical wastes, etc.).

With regard to all of the above described embodiments, the increased pressure in any one or more gas impermeable enclosures need not be provided solely by one corrosion preventing device. Rather, the increased pressure or pressures can be supplied by one or more devices. In such a case, the pressure supplied alone (if any) by the corrosion preventing device can be less than the external pressure outside of the gas impermeable enclosure. Additionally, the amount of desiccant that is present within the one or more gas impermeable areas of the present corrosion protection devices depends on the pH desired for the internal areas thereof.

EXAMPLES

Table 1 below sets forth information regarding the metal samples that were used to test the corrosion protection ability of known systems versus the corrosion protection ability of systems in accordance with the present invention. Table 2 below sets forth the corrosion inhibitor and atmosphere used in the examples detailed below. As noted above, the present invention is not limited to just the protection of metal items using the corrosion inhibitor—film—inert gas combinations shown below, rather any type of article can be protected given the right enclosure—corrosion preventing device combination. Such useful combinations would be apparent to one of ordinary skill in the art given the nature of the article to be protected.

TABLE 1

| Metal | Composition | Size |
|---|---|---|
| Steel - Low Alloy | St/LA<br>(Fe 98.9%<br>C 0.2%<br>Si 0.3 %<br>Mn 0.6%) | 100 × 100 × 1 (mm) |
| Steel - Austenitic Stainless | St/AS<br>(Fe 71%<br>Cr 18%<br>Ni 9%<br>Mn 2%) | 100 × 100 × 1 (mm) |
| Aluminum | Al (at least 90% pure) | 100 × 100 × 1 (mm) |
| Copper | Cu (at least 90% pure) | 100 × 100 × 1 (mm) |
| Silver | Ag (at least 95% pure) | 30 × 50 × 0.5 (mm) |

TABLE 2

| Method | Corrosion Inhibitor | Concentration[1] |
|---|---|---|
| Previous Methods (PM) | $C_{13}H_{26}O_2N$ (known methods) | less than $1 \times 10^{+2}$ Pascals |
| Inventive Methods (IM) | $C_{13}H_{26}O_2N$ (inventive methods) | at least about $1 \times 10^{-2}$ Pascals with the remainder of the increased pressure being supplied by a $N_2$ atmosphere |

[1]This is only the partial pressure of the vapor phase of volatile or vapor phase corrosion inhibitor. The total pressure in the at least one gas impermeable enclosure of the present invention is almost always greater than the external pressure outside of the gas impermeable enclosure(s). Therefore, in most cases the total pressure within the gas impermeable enclosure(s) of the present invention must be at least about $1.02 \times 10^{+5}$ Pascals.

In the examples given below any one of a variety of desiccants can be used (where required), for example, CaO, NaOH, $NaHCO_3$, $K_3BO_3$, $Zn_3(BO_3)_2$ and/or silica gel. The amount of desiccant used in the present invention depends upon the pH or relative humidity level desired within the at least one gas impermeable enclosure. In one embodiment, the pH therein should be, in one embodiment, within the range of about 3 to about 13. In another embodiment, the pH therein should be, in one embodiment, within the range of about 5 to about 13. In still another embodiment, the pH in the at least one enclosure should be within the range of about 7 to about 13. In yet another embodiment, the pH within the at least one enclosure should be within the range of about 9.5 to about 13, or even about 11 to about 13. In one embodiment, the relative humidity within the at least one enclosure should be less than about 10 percent, in another less than about 5 percent, in still another less than about 1 percent.

When an inert gas is utilized in the present invention, the partial pressure of the inert gas within the at least one gas impermeable enclosure should be at least about $1 \times 10^{+2}$ Pascals with the total pressure within the enclosure(s) being higher than the pressure outside of the enclosure(s). In the situation where more than one inert gas is present or some other gas is present, the individual pressure of any or all of the gases can be lower than $1 \times 10^{+2}$ Pascals so long as the total pressure within each of the one or more gas impermeable enclosures is greater than the external pressure.

As known to those of ordinary skill in the art, NaOH will remove chloride ions ($Cl^-$) present in an atmosphere, CaO will remove hydrogen sulfide, sulfur dioxide, and water vapor present in an atmosphere, and a number of compounds (silica gel, activated alumina, calcium chloride and/or zinc chloride) will remove water vapor from an atmosphere. Accordingly, the desiccant used in the present invention is not restricted to that used in the examples below so long as the desiccant used in the inventive system effectively absorbs the corrosive elements present in the atmosphere in the enclosure where the article to be protected resides. Furthermore, the protection results obtained in the following examples are not limited to any one corrosion inhibitor. Rather any suitable corrosion inhibitor, in view of the elements to be protected against, can be used with similar results. Accordingly, the following examples should not be interpreted to be limited to any one desiccant, film composition, inert gas or increased pressure atmosphere, or corrosion inhibitor.

All of the following examples were tested in the following environment: sulfur dioxide concentration 40 mg/m$^3$; chloride ion ($Cl^-$ion) concentration 1.4 mg/m$^2$ (provided by a fabric saturated with a chloride containing solution having a known concentration); hydrogen sulfide 10 mg/m$^3$; and a relative humidity 95–100%. The temperature each example was exposed to was varied over the range of about +55° C. to about 20° C.

The compositions of the Examples are detailed in Table 3, while the test results when each protection method is used to protect one piece of each of the metals noted above in Table 1 are provided in Table 4. The Examples below compare four previous methods of protection (previous methods (PM) 1 through 4) with nine methods of corrosion protection according to the present invention (inventive methods (IM) 1 through 9). It should be noted that although the term shell is used to refer to the enclosures of the previous protection methods, it does not mean in these four cases that these shells meet the gas impermeability requirements of the present invention.

As noted above, the corrosion inhibitor, where present, utilized in each example is detailed above in Table 2.

TABLE 3

Combinations of Corrosion Protection Methods

| | | | Corrosion Preventing Device[1] | | Pressure (Pa)[2] | |
|---|---|---|---|---|---|---|
| | Films | | Between | | Between | |
| Example | Shell 1 | Shell 2 | Inside Shell 1 | Shell 1 and 2 | Inside Shell 1 | Shell 1 and 2 |
| PM1 | P/E + VCI[3] | — | — | — | about $1.0 \times 10^{+2}$ | — |
| PM2 | P/E + VCI | — | D/C Capsule | — | | |
| PM3 | P/E | — | VCI Capsule + D/C Capsule | — | | |
| PM4 | P/E | — | Single VCI + D/C Capsule | — | | |
| IM1 | P/E | — | VCI Capsule + I/G Atmos. | — | $1.1 \times 10^{+5}$ | — |
| IM2 | P/E | — | I/G Capsule | — | $1.1 \times 10^{+5}$ | — |
| IM3 | P/E + VCI | P/E | — | I/G Capsule | $1.2 \times 10^{+5}$ | $1.1 \times 10^{+5}$ |
| IM4 | P/E | P/E | VCI Capsule + I/G Atmos. | I/G Capsule | $1.2 \times 10^{+5}$ | $1.1 \times 10^{+5}$ |
| IM5 | P/E | — | VCI +I/G Atmos. | — | $1.1 \times 10^{+5}$ | — |
| IM6 | P/E | P/E | VCI + I/G Atmos. | I/G Atmos. | $1.2 \times 10^{+5}$ | $1.1 \times 10^{+5}$ |
| IM7 | P/E | P/E | VCI Capsule + I/G Atmos. | D/C Capsule | $1.2 \times 10^{+5}$ | $1.1 \times 10^{+5}$ |
| IM8 | P/E + VCI | P/E | — | D/C Capsule | $1.2 \times 10^{+5}$ | $1.1 \times 10^{+5}$ |
| IM9 | PIE + VIC | P/E + D/C | — | — | $1.2 \times 10^{+5}$ | $1.1 \times 10^{+5}$ |

[1]The corrosion protection devices used in both the previous methods (PM1–PM4) and those used in the inventive methods (IM1–IM9) where chosen in view of the test conditions.
[2]Note:
in most cases, but not all, the external pressure outside the corrosion protection system will be atmospheric pressure which is approximately 101 KPa ($1.01 \times 10^{+5}$ Pascals).

TABLE 3-continued

Combinations of Corrosion Protection Methods

| | Corrosion Preventing Device[1] | | Pressure (Pa)[2] | |
|---|---|---|---|---|
| | Films | | Between | Between |
| Example | Shell 1 | Shell 2 | Inside Shell 1 | Shell 1 and 2 | Inside Shell 1 | Shell 1 and 2 |

[3]Note:
P/E + VCI denotes a polyethylene film which contains therein one or more layers, pockets, etc. of volatile or vapor phase corrosion inhibitor. Such films were discussed in detail above.

Note: as used above P/E is a polyethylene film, VCI is short for vapor phase or volatile corrosion inhibitor, D/C is short for desiccant, I/G for inert gas, and atmos. for atmosphere. The polyethylene films used in IM1–IM9 can be any thickness so long as they meet one or more of the gas impermeability requirements set forth above. Additionally, the desiccant used above was an equal combination of CaO, NaOH, NaHCO$_3$, K$_3$BO$_3$, Zn$_3$(BO$_3$)$_2$ and silica gel. Also, where two shells are present shell 1 is always the inner shell and shell 2 is always the out shell (see FIGS. 4 and 5).

The results from exposing certain metal samples (see Table 1 for the specifics thereof) to a corrosive environment while being protected by one of the above detailed previous or inventive systems are given below in Table 4.

TABLE 4

| Example (Table 3) | Time In Hours Until Corrosion or Tarnish is Noticed on the Metals of Table 1 | | | | |
|---|---|---|---|---|---|
| | St/LA | St/AS | Al | Cu | Ag |
| PM1 | 25 | 60 | 100 | 45 | 55 |
| PM2 | 40 | 75 | 110 | 60 | 70 |
| PM3 | 35 | 50 | 80 | 65 | 45 |
| PM4 | 30 | 40 | 75 | 50 | 35 |
| IM1 | no less than 200 | | | | |
| IM2 | no less than 220 | | | | |
| IM3 | no less than 300 | | | | |
| IM4 | no less than 280 | | | | |
| IM5 | no less than 300 | | | | |
| IM6 | no less than 300 | | | | |
| IM7 | no less than 190 | | | | |
| IM8 | no less than 160 | | | | |
| IM9 | no less than 145 | | | | |

All of the articles to be protected were hermetically sealed within the enclosure of each example. In the case where there was more than one shell present in an example, the article to be protected was hermetically sealed within the innermost shell, which was then sealed within the outer shell (see discussion above with regard to the Figures).

The above results are not limited to the instance when the corrosion preventing device is in capsule or encapsulated form, rather the corrosion preventing device can take any form, as is discussed above.

Based on the foregoing results, it has been determined that the present methods of corrosion protection offer longer periods of protection with regard to previous methods using the same amounts of desiccant and/or corrosion inhibitor. While not wishing to be bound to any one theory, it is believed that increased pressure atmosphere(s) possible within the one or more gas impermeable shells slows down the entry of any external corrosive elements, while allowing the at least one corrosion preventing devices contained therein to protect against any corrosive elements present within the at least one shell.

It will be apparent to those of ordinary skill in the art that the service life of the present invention can be increased if the amount, concentration and/or pressure of the at least one corrosion preventing device is increased. Furthermore, the service life can be increased by incorporating therein some type of replenishment system for periodically replenishing the at least one corrosion preventing device.

Although the invention has been shown and described with respect to certain embodiments, it is obvious that equivalent alterations and modifications will occur to others skilled in the art upon the reading and understanding of this specification. In particular with regard to the various functions performed by the above described components, the terms (including any reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of protecting one or more articles from corrosion comprising the steps of:
   (A) placing the one or more articles to be protected in a corrosion protection system, the corrosion protection system comprising a gas impermeable enclosure for holding one or more articles to be protected;
   (B) placing at least one corrosion preventing device into the gas impermeable enclosure, wherein the at least one corrosion preventing device is selected from a desiccant, a corrosion inhibitor, an inert gas, or a combination thereof; and
   (C) sealing the gas impermeable enclosure,
      wherein the gas impermeable enclosure comprises at least two gas impermeable shells comprising an outer shell and an inner shell, wherein the inner and outer shells are adapted to maintain internal pressures greater than the external pressure outside of the corrosion protection system and the at least two shells define a gas impermeable space therebetween, and the pressure inside the inner shell is less than the pressure inside the space between the inner and outer shells.

2. The method of claim 1, wherein the at least two shells are formed from gas impermeable structures which contain at least one layer which are independently selected from gas impermeable polymer layers, metal layers or fabric layers.

3. The method of claim 2, wherein the at least one of the polymer layers is formed from at least one polyolefin polymer.

4. The method of claim 2, wherein at least one desiccant and/or corrosion inhibitor is contained within at least one of the gas impermeable polymer layers and/or fabric layers.

5. The method of claim 1, wherein at least one desiccant, corrosion inhibitor and/or inert gas is contained in the space between the inner and outer shells.

6. The method of claims 1, wherein the gas impermeable enclosure further comprises at least one delivery system for delivering periodic doses of a desiccant, corrosion inhibitor and/or inert gas.

7. The method of claim 6, wherein the gas impermeable enclosure further comprises at least one monitoring system for monitoring at least one internal pressure inside the gas impermeable enclosure.

8. The method of claim 7, wherein the gas impermeable enclosure further comprises at least one alarm system for signaling a drop in at least one internal pressure.

9. The method of claim 3, wherein the polyolefin polymer is selected from polyethylene, polypropylene and ethylene/vinyl acetate copolymers.

10. The method of claim 1, wherein at least one desiccant, corrosion inhibitor and/or inert gas is contained in the space between the inner and outer shells, and at least one desiccant, corrosion inhibitor and/or inert gas is contained inside the inner shell.

11. The method of claim 1, wherein at least one desiccant, corrosion inhibitor and/or inert gas is contained inside the inner shell.

12. The method of claim 1, wherein step (C) is accomplished using a heat sealing, an adhesive seal, or a mechanical sealing means.

13. A method of protecting one or more articles from corrosion comprising the steps of:
  (A) placing the one or more articles to be protected in a corrosion protection system, the corrosion protection system comprising a gas impermeable enclosure for holding one or more articles to be protected;
  (B) placing at least one corrosion preventing device into the gas impermeable enclosure, wherein the at least one corrosion preventing device is selected from a desiccant, a corrosion inhibitor, an inert gas, or a combination thereof; and
  (C) sealing the gas impermeable enclosure,
    wherein the gas impermeable enclosure comprises at least two gas impermeable shells comprising an outer shell and an inner shell, wherein the at least two shells are adapted to maintain internal pressures greater than the external pressure outside of the corrosion protection system and the at least two shells define a gas impermeable space therebetween, and the pressure inside the space between the outer shell and the inner shell is less than the pressure inside the inner shell.

14. The method of claim 13, wherein the at least two shells are formed from gas impermeable structures which contain at least one layer which are independently selected from gas impermeable polymer layers, metal layers or fabric layers.

15. The method of claim 13, wherein at least one desiccant, corrosion inhibitor and/or inert gas is contained in the space between the inner and outer shells.

16. The method of claim 13, wherein at least one desiccant, corrosion inhibitor and/or inert gas is contained in the space between the inner and outer shells, and at least one desiccant, corrosion inhibitor and/or inert gas is contained inside the inner shell.

17. The method of claim 13, wherein at least one desiccant, corrosion inhibitor and/or inert gas is contained inside the inner shell.

18. A corrosion protection system comprising:
  a gas impermeable enclosure for holding one or more articles to be protected; and
  at least one corrosion preventing device located within the gas impermeable enclosure,
  wherein the at least one corrosion preventing device is selected from a desiccant, a corrosion inhibitor, an inert gas, or a combination thereof,
  wherein the gas impermeable enclosure comprises at least two gas impermeable shells comprising an inner shell and an outer shell, and
  wherein the inner and outer shells are adapted to maintain internal pressures greater than the external pressure outside of the corrosion protection system and the at least two shells define a gas impermeable space therebetween, and the pressure inside the inner shell is less than the pressure inside the space between the inner and outer shells.

19. The system of claim 18, wherein, wherein the at least two shells are formed from gas impermeable structures which contain at least one layer which are independently selected from gas impermeable polymer layers, metal layers or fabric layers.

20. The system of claim 19, wherein the at least one of the polymer layers is formed from at least one polyolefin polymer.

21. The system of claim 20, wherein the polyolefin polymer is selected from polyethylene, polypropylene and ethylene/vinyl acetate copolymers.

22. The system of claim 19, wherein at least one desiccant and/or corrosion inhibitor is contained within at least one of the gas impermeable polymer layers and/or fabric layers.

23. The system of claim 18, wherein the gas impermeable enclosure further comprises at least one delivery system for delivering periodic doses of a desiccant, corrosion inhibitor and/or inert gas.

24. The system of claim 23, wherein the gas impermeable enclosure further comprises at least one monitoring system for monitoring at least one internal pressure inside the gas impermeable enclosure.

25. The system of claim 24, wherein the gas impermeable enclosure further comprises at least one alarm system for signaling a drop in the at least one internal pressure.

26. The system of claim 18, wherein at least one desiccant, corrosion inhibitor and/or inert gas is contained in the space between the inner and outer shells.

27. The system of claim 18, wherein at least one desiccant, corrosion inhibitor and/or inert gas is contained in the space between the inner and outer shells, and at least one desiccant, corrosion inhibitor and/or inert gas is contained inside the inner shell.

28. The system of claim 18, wherein at least one desiccant, corrosion inhibitor and/or inert gas is contained inside the inner shell.

29. A corrosion protection system comprising:
  a gas impermeable enclosure for holding one or more articles to be protected; and
  at least one corrosion preventing device located within the gas impermeable enclosure,
  wherein the at least one corrosion preventing device is selected from a desiccant, a corrosion inhibitor, an inert gas, or a combination thereof,
  wherein the gas impermeable enclosure comprises at least two gas impermeable inner and outer shells, and
  wherein the at least two shells are adapted to maintain internal pressures greater than the external pressure outside of the corrosion protection system and the at least two shells define a gas impermeable space therebetween, and the pressure inside the space between the inner and outer shells is less than the pressure inside the inner shell.

30. The system of claim 29, wherein the at least two shells are formed from gas impermeable structures which contain at least one layer which are independently selected from gas impermeable polymer layers, metal layers or fabric layers.

31. The system of claim 29, wherein at least one desiccant, corrosion inhibitor and/or inert gas is contained in the space between the inner and outer shells.

32. The system of claim 29, wherein at least one desiccant, corrosion inhibitor and/or inert gas is contained in the space between the inner and outer shells, and at least one desiccant, corrosion inhibitor and/or inert gas is contained inside the inner shell.

33. The system of claim 29, wherein at least one desiccant, corrosion inhibitor and/or inert gas is contained inside the inner shell.

* * * * *